United States Patent [19]

Griffin

[11] 4,375,309
[45] Mar. 1, 1983

[54] ZERO INSERTION FORCE CONNECTOR BLOCK

[75] Inventor: Wendell L. Griffin, South Bend, Ind.

[73] Assignee: Wells Electronics, Inc., South Bend, Ind.

[21] Appl. No.: 220,079

[22] Filed: Dec. 24, 1980

[51] Int. Cl.³ .......................................... H01R 13/639
[52] U.S. Cl. .............................. 339/75 M; 339/17 CF; 339/176 M
[58] Field of Search .............. 339/17 CF, 74 R, 75 R, 339/75 M, 75 MP, 176 MP

[56] References Cited

U.S. PATENT DOCUMENTS

| 3,568,134 | 3/1971 | Anhalt et al. | 339/75 MP |
| 3,594,698 | 7/1971 | Anhalt | 339/75 M |
| 3,665,370 | 5/1972 | Hartmann | 339/176 MP |
| 3,818,416 | 6/1974 | Reimer | 339/17 CF |
| 3,905,670 | 9/1975 | Anhalt et al. | 339/75 MP |
| 3,977,749 | 8/1976 | Langenbach | 339/75 M |
| 4,026,623 | 5/1977 | Goodman et al. | 339/75 M |
| 4,054,347 | 10/1977 | Mouissie | 339/75 M |
| 4,189,199 | 2/1980 | Grau | 339/17 CF |
| 4,217,020 | 8/1980 | Holland | 339/75 M |
| 4,266,840 | 5/1981 | Seidler | 339/75 M |

FOREIGN PATENT DOCUMENTS

| 2748298 | 4/1978 | Fed. Rep. of Germany | 339/75 M |
| 2275964 | 1/1976 | France | 339/74 R |

Primary Examiner—John McQuade

[57] ABSTRACT

A zero insertion force connector block including a base with side walls, a row of terminals extending along each side wall, a pair of free-floating follower members positioned in the base between the rows of terminals and a rotary cam having cam lobes in the interface between the followers, radial arms extending from the lobes and a handle extending along the block joining the ends of the arms such that rotation of the handle forces the followers apart to stress the terminals and form electrical connections between the terminals and leads inserted into the block.

17 Claims, 9 Drawing Figures

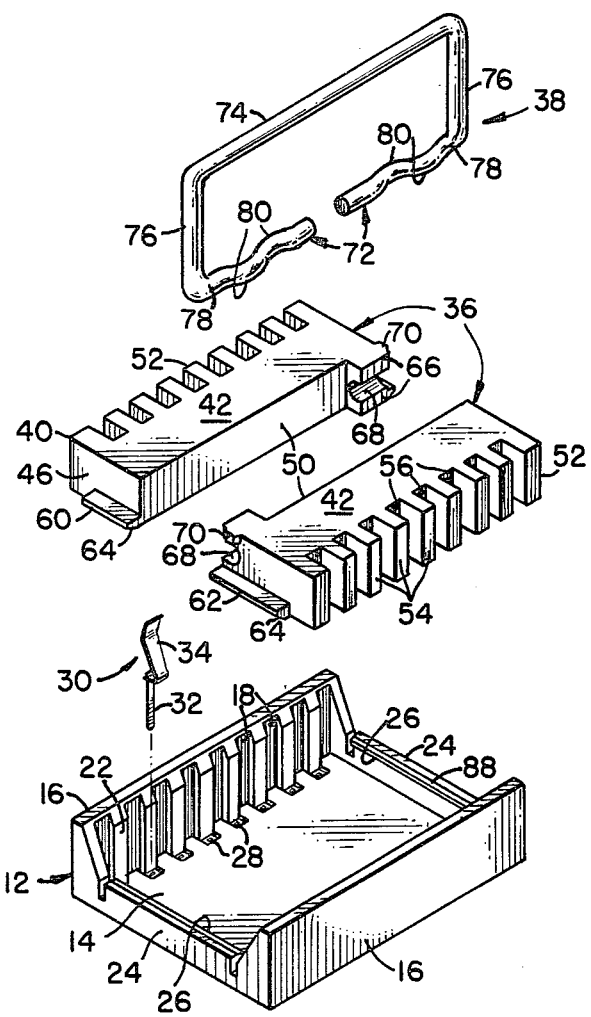
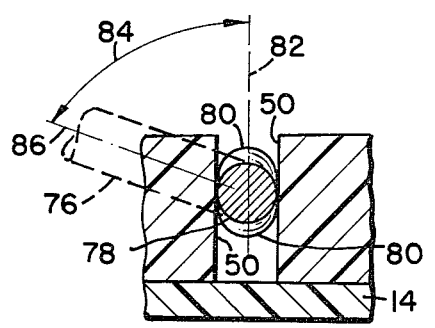
FIG. 8
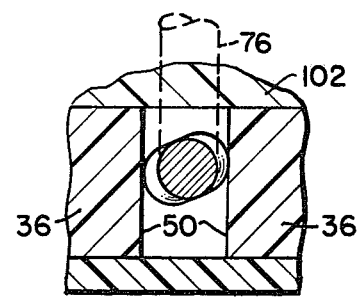
FIG. 9

ZERO INSERTION FORCE CONNECTOR BLOCK

The invention relates to zero insertion force connector blocks of the type particularly adapted to form simultaneous electrical connections between two spaced rows of terminals in the block and two corresponding rows of contacts inserted into the block, typically leads extending from a DIP module. The connections are formed by two followers forced apart by movement of a cam located between the followers.

Reimer U.S. Pat. No. 3,818,416 and Mouissie U.S. Pat. No. 4,054,347 disclose zero insertion force blocks where electrical connections between rows of terminals and leads are formed by rotating cams. In the Reimer patent, a pair of individually operable cams are rotated to form the electrical connections. In the Mouissie patent, FIG. 3, a single rotary cam carried by the body moves integral molded links which in turn deform side walls and sandwich DIP leads against respective contact terminals in the block. Anhalt U.S. Pat. No. 3,594,698 shows a zero insertion force block using a rotary cam, followers, and opposed sets of terminals which form electrical connections when the cam is rotated and forces the followers against the terminals. Split insulators are forced outwardly by a rotary cam to stress the contacts and form electrical connections.

The present invention relates to an improved zero insertion force connector block of the type used to form ZIF connections between two rows of contacts in the block and two rows of leads on a dual-in-line package or like circuit element. The block includes a base having side walls with a row of terminals extending along the inside of each side wall and normally spaced away from the side walls sufficiently to allow leads to be inserted between the terminals and the side walls. A pair of free-floating follower members are confined within the body between the terminals and define a central interface. A latch connection holds the followers against the bottom of the body while permitting free movement toward and away from the terminals. A rotary cam includes a pair of end work portions in the interface at the ends of the followers. The cam also includes radial arms at the ends of the followers extending along the ends of the block and a longitudinal handle joining the outer ends of the radial arms outwardly of the block. The cam is confined on the block by the work portions which float in the interface between followers.

When the DIP block is in the open position and ready to receive leads of a DIP, the cam is rotated to a position when the handle is over a side wall, the lateral height of the cam lobes is reduced and the contacts are spaced from the side walls. In this position, the DIP leads are freely inserted into the block between the contacts and the side walls. When fully inserted, the DIP module rests on the top of the followers. The cam handle portion is then rotated up to a vertical position so that the lobes in the work portions at both ends of the followers force the followers apart to engage the contacts and force them against the DIP leads to form the desired electrical connections. Locking detents are provided on one end of each of the like follower members and lie in the path of rotary movement of the cam arms. As the cam is rotated to the closed, contact position, one arm rides over one of the detents so that when the followers are fully extended the detents hold the cam vertically and prevent accidental opening of the block. In this position the cam handle is above the DIP body to provide a visual indication the block is closed and to provide a physical barrier against attempted withdrawal of the DIP module from the block. The cam may be constructed so that the arms and handle are movable only to one side of the block.

The floating connection between the follower members and the block body and between the cam and the follower members assures that when the block is closed the cam and the members form a floating compressively rigid assembly balanced between the stressed terminals on both sides of the block. The balanced assembly equalizes the contact forces on both sides of the block, reduces frictional drag on the cam and minimizes the effects of tolerance errors in the block components.

The block is assembled from a minimum number of easily formed, inexpensive components without the necessity of complicated assembly apparatus and with low labor costs. The design efficiently uses space so that the block occupies a minimum amount of room on a circuit board. Efficient space utilization is an important advantage where circuits are constantly being made smaller and less and less space is available for a given circuit component.

Other objects and features of the invention will become apparent as the description proceeds, especially when taken in conjunction with the accompanying drawings illustrating the invention, of which there are two sheets and one embodiment.

IN THE DRAWINGS

FIG. 7 is an exploded view of the ZIF block; and

Figure 2:
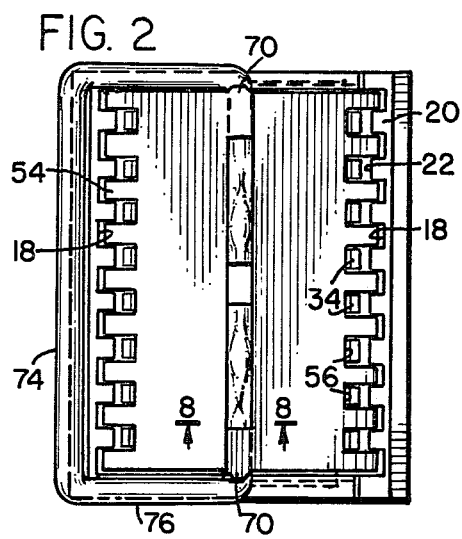
FIG. 2 is a top view of the ZIF block of FIG. 1.
Figure 3:
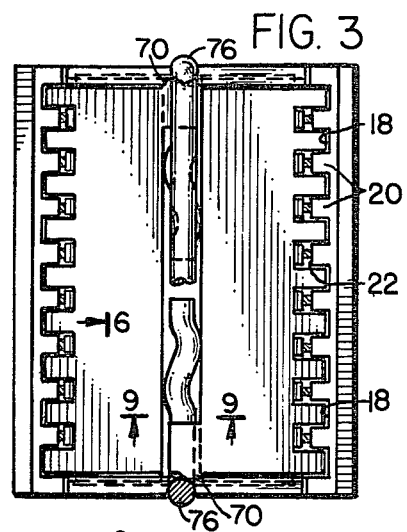
FIG. 3 is a view like FIG. 2 showing the block in the closed position.

FIGS. 8 and 9 are partial sectional views taken along lines 8—8 of FIG. 2 and 9—9 of FIG. 3, respectively.

Zero insertion force (ZIF) block 10 includes a body 12 preferably molded from an insulating plastic material having a bottom wall 14 and opposed side walls 16 running longitudinally along the length of the body. A series of vertical grooves 18 are formed in the inner surfaces of the side walls extending from the bottom wall to the top of the side walls. The grooves are separated by vertical stop ridges 20 having contact surfaces 22 facing the interior of the body.

Figure 6:
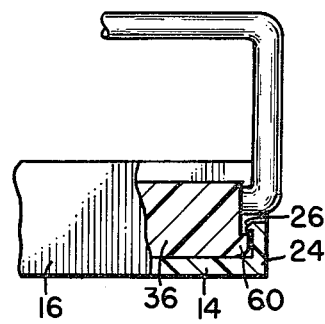
FIG. 6 is a partially broken-away view taken along line 6—6 of FIG. 3.

Integral, flexible latches 24 project upwardly from the ends of the bottom wall 14 and include inwardly projecting retaining lips 26 extending a short distance inwardly of the latches as illustrated in FIG. 6. The latches extend substantially completely across the ends of the body between the side walls 16.

Two rows of terminal-receiving holes 20 are formed through the thickness of the bottom wall adjacent the side walls, with each hole 28 located below a contact surface 22. Body 12 carries a row of terminals 30, illustrated in FIG. 7, along the inner surface of each side wall 16. Terminals 30 include terminal tails 32 and resilient contact portions 34. The tails 32 extend through holes 28 below the body for subsequent attachment to circuit lines leading to the block. Conventionally, the block is mounted on a circuit board with the exposed terminal tails 32 soldered to the board. The resilient contact portions 34 extend upwardly from the bottom wall 14 at each surface 22. Terminals 30 may be stamped-formed on a carrier strip with spacing between terminals equal to the spacing between the terminal holes 28 and with the strip attached to the upper end of the contact portions 34. In this way, all of the terminals in a single row may be inserted into the holes in the row at one time while attached to the strip. After insertion, the strip may be broken away from the terminal.

The block 10 includes a pair of like insulating follower members 36 confined within body 12 between the side walls with a rotary cam 38 held by the follower members at the interface between the members. Each member includes parallel upper and lower surfaces 42 and 44, end surfaces 46 and inner and outer side surfaces 50 and 52. Inner surfaces 50 are flat. A series of grooves and ridges 54 and 56 extend along the outer surfaces 52 complementary with the ridges and grooves 18 and 20 on the body side walls. The lower ends of ridges 54 are beveled at 58 to provide terminal clearance, during the assembly operation.

Lock ridges 60 and 62 extend along the bottoms of the end surfaces 46 and include downwardly facing beveled surfaces 64. A pair of cam orienting fingers 66 extend outwardly of each follower side surface 50 at one end of the surface to define a cam-receiving slot 68 therebetween. The fingers extend a short distance inwardly from an end surface. The width and depth of the slot are approximately equal with the bottom of the slot being semi-cylindrical. The bottom of the slot 68 is flush with surface 50. As illustrated in FIG. 7, end wall and lock ridge 62 extend along the outer surfaces of the fingers. The upper finger 66 is provided with an outwardly projecting cam detent 70.

The cam member 38, which may be formed from a length of metal stock, is generally flat and rectangular in shape with a major side formed from a pair of spaced axially aligned work portions 72, the opposite major side formed by straight handle 74 with the short sides of the cam formed by straight radial arms 76. Each work portion 72 includes a straight cylindrical bearing portion 78 adjacent an arm 76 and a pair of longitudinally spaced diametrically opposed cam lobes 80. The crests of the lobes of both work portions lie in a common plane 82 extending through the work portions axis and oriented at an acute angle 84 to the plane 86 defined by the flat cam. See FIG. 8. The free ends of the work portions are spaced from each other to provide a separation on the work portion-side of the cam, but may be joined.

The ZIF block 10 is assembled by first seating terminals 30 in terminal holes 28 as previously described and then placing cam 38 between the inner side surfaces 50 of a pair of like follower members 36 oriented as in FIG. 7 and moving the members toward each other so that the cam bearings 78 fit in the slots 68. The cam is rotated to one side so that the cam lobes are oriented vertically and the ends of the fingers 66 rest on the side surface 50 of the adjacent cam member. The cam bearing 78 has a diameter slightly less than the width of the slots 68 so that the cam may be rotated easily when held within the slots.

The follower member-cam assembly is then lowered into the interior of body 12 so that the lock ridges 60 and 62 are moved down and the bevel surfaces 64 engage the upper beveled surfaces 88 of the lips 26, flex the latches 24 outwardly to move the lips beyond the ridges and permit seating of the follower members flush on the upper surface of body bottom wall 14. In this position the lips on the latches extend inwardly over the lock ridges 60 and 62 to confine the follower members within the body. There is a sliding fit between the ridges and latches permitting movement of the follower members toward and away from the side walls 16. See FIG. 6. With the follower members secured in the body the ridges 54 extend into the grooves 18 on the inner sides of the body side walls and the terminal contact portions 34 are fitted within follower member grooves 56. See FIG. 2.

Figure 1:
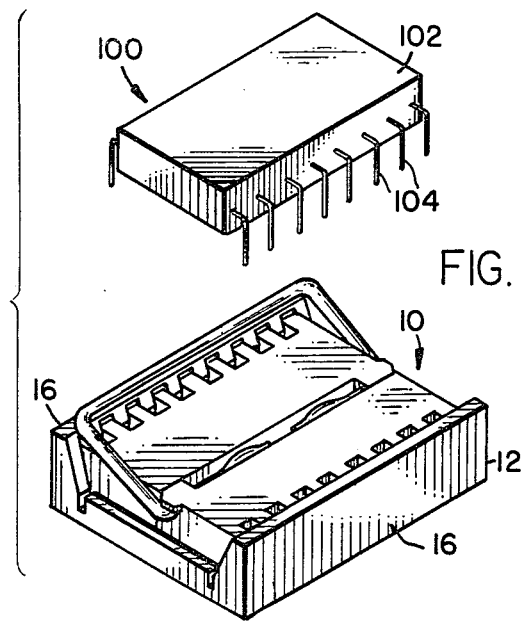
FIG. 1 is a perspective view of a DIP in position to be loaded in a ZIF block according to the invention.
Figure 4:
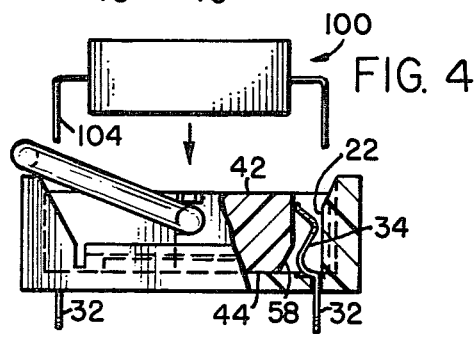
FIGS. 4 and 5 are end views of FIGS. 2 and 3 respectively.

In the open position of the assembled ZIF block 10 illustrated in FIGS. 1, 2 and 4, the plane of the cam lobes is vertical, the follower inner side surfaces 50 lie flush on the cam work portions 72 and the cam handle 74 rests on the top of one side wall 16. The ends of the fingers 66 are flush on surface 50 of the adjacent member. The plane 82 defined by cam lobes is at an acute angle to the plane of the cam to assure the cam rests on the side wall when the lobes are vertical. The contact portions may lightly engage the follower members and bias them against the cam work portions.

Figure 5:
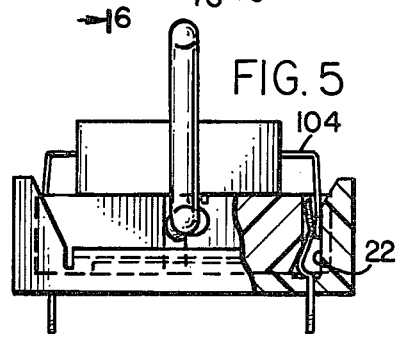

ZIF block 10 is primarily intended to form electrical connections with a dual inline package 100 having a body 102 with rows of contact leads 104 extending downwardly from opposite sides of the body. The package is freely loaded into the block 10 by positioning it over the block as shown in FIG. 4 and then lowering it toward the block so that the individual leads 104 move freely into the spaces between contact surfaces 22 and the terminal contact portions 34. See FIGS. 4 and 5. The package 100 is fully inserted when the lower surface of body 102 rests flush on the top surfaces 42 of the follower members as shown in FIG. 5.

With the module fully inserted into the block, electrical connections are formed between the module leads and the terminals in the block by rotating the cam 38 upwardly about the slots 68 so that the radial arms are in the vertical position. FIG. 8 illustrates the position of the cam lobes with respect to the follower member inner surfaces 50 when the cam is in the open position and FIG. 9 illustrates the same relationship when the cam is in the closed position and the radial arms are vertical. As the cam is rotated through angle 84, the cam lobes engage surfaces 50 and force the follower members apart. The bottoms of grooves 56 engage the terminal contact portions 34 and force the portions against the ends of the package leads so that the leads are sandwiched between the contacts and surfaces 22. In this way, reliable high-pressure electrical connections are formed between the terminals and the leads following the full ZIF insertion of the package into the block.

As the cam is rotated upwardly to the vertical position and the follower members are forced apart, fingers 66 move away from the adjacent surface 50 and the slots are opened at their ends. The cam work portions remain centered between the surfaces by the cam lobes with bearing portions 78 moving away from the bottoms of slots 68.

When the cam is rotated to the vertical position, one radial arm 76 is forced past a detent 70 just before the arm becomes vertical and the block is in the closed, contact position of FIG. 3. In this position, the follower members have separated sufficiently so that the normally opposed detents 70 as shown in FIG. 2, are separated laterally and each engaged opposite sides of an arm 76 to hold the cam in the vertical position. Contrast FIGS. 2 and 3.

As the cam is rotated up from the open position to the closed position, the straight handle 74 clears the module 100 inserted in the block and, in the closed position, is positioned vertically above the module. The vertical cam provides a visual indication that the block 10 is closed and the electrical connections are established between the module and the block terminal. Further, its physical location above the module deters attempts to remove the module from the closed block. If desired, the body 12 may be provided with indicia on one of the side walls 15 to indicate the direction in which the cam 38 is rotated to open the block for removal of package 100.

The follower members 34 are confined within the body 12 by latches 24 and are free to move toward and away from the side walls 16. The cam in turn is confined between the inner side surfaces 50 of the follower members and is centered within the interface between the follower members by either the engagement between the bearing portions 78 and slots 68 or the engagement between the equal height cam lobes 80 and sides 50. The cam is not attached to the body. When the block is moved to the closed position, the two followers and cam become a compressively rigid assembly extending between the stressed resilient terminal contact portions 34 free of the body. This construction provides uniform contact pressure on the terminals of both sides of the block and provides the formation of reliable, uniform high-pressure electrical connections with the package leads 104.

In prior blocks, central cams extending through connections on the body of the block have been used to force apart members on both sides of the cam. In the event the terminal loading forces on both sides of the cam are not equal, the cam is biased against one side of the block at the connections and the force required to move the cam with respect to the body is increased by friction, whether the cam is of the rotary or longitudinal type. The construction of the present block eliminates this difficulty by assuring that when the block is in the closed position the cam and followers form a compressively rigid assembly floating between the two rows of resilient terminal contact portions free of the body. The construction also compensates for dimensional tolerance errors in the block components.

The terminal is manufactured from a limited number of inexpensive, easily formed parts which are readily assembled to form the block at a minimum of expense. The block is easily miniaturized to receive conventional DIP modules or other types of circuit elements. While block 10 as illustrated mates with a package 100 having dependent contact leads 104, it may be modified to mate with circuit elements having other types of contacts such as plated contacts on a planar insulating base, ribbon cable contacts, individual leads and the like. Terminals 30 are representative of a number of types of terminals which may be used in the block for forming the ZIF connections. Other types of terminals may be used. The leads which form the connections with the terminals may be inserted into the block adjacent the terminals from the top or through openings formed in the side walls.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim my invention is:

1. A zero insertion force connector block of the type having a body, two rows of contact terminals on opposite sides of the body, a pair of follower members between the rows of terminals with one follower member extending along each row of terminals and an interface between the follower members, and means securing the follower members to the body while permitting free movement of the follower members towards and away from the terminals wherein the improvement comprises an expansion element loosely confined in the interface for movement free of the body toward and away from the terminal rows, said element being movable between a first position where the follower members are free for movement towards each other to reduce the width of the interface and a second position where the element forces the follower members apart to increase the width of the interface, each follower member stresses terminals in one of the rows and the follower members and element float between the terminal rows, movement of said element between said positions controlling the movement of said terminals between open positions and closed positions wherein the terminals make electrical connections with adjacent contacts.

2. A zero insertion force connector block as in claim 1 wherein the expansion element comprises a cam.

3. A zero insertion force connector block as in claim 2 wherein when the cam is in the second position, the follower members and cam comprise a compressively rigid assembly floating between the terminal rows and the terminals are stressed to form electrical connections with contacts.

4. A zero insertion force connector block as in claim 3 including means for retaining said cam in said second position.

5. A zero insertion force connector block as in claim 3 including a ridge and slot connection between the body and each follower member extending between the terminal rows.

6. A zero insertion force connector block as in claim 5 wherein said ridge and slot connection includes ridges on the follower members extending between the rows, a latch projecting from the body past the ridges, the latch including a retaining lip overlying the ridges so as to confine the retaining member to the body.

7. A zero insertion force connector block as in claim 6 wherein said latch is flexible and extends outwardly from the body and the follower members are moved into the body to form said connection by flexing the latch outwardly, moving the ridges past the lip and snapping the latch back so that the lip overlies the ridges.

8. A zero insertion force connector block as in claim 3 wherein the cam includes a rotary work portion in the interface having a cam lobe and a bearing, and a device for rotating the cam, one of the follower members including a connection surrounding said bearing whereby rotation of the cam moves the follower members apart to engage the terminals.

9. A zero insertion force connector block as in claim 3 wherein the cam is generally rectangular in shape and includes a pair of like rotary work portions confined within the interface and defining one side of the cam, a handle generally parallel to the work portions defining the opposite side of the cam and a pair of radial arms joining the ends of the work portions to the handle and defining the side walls of the cam, the work portions each including a bearing and a pair of opposed cam lobes and the follower members including a pair of spaced slots at the interface, said bearings positioned within said slots to locate the cam within the interface, whereby rotation of the cam about the slots forces the follower members apart.

10. A zero insertion force connector block as in claim 9 wherein said follower members are alike, each follower member including one of said bearing slots.

11. A zero insertion force connector block as in claim 10 including a cam detent on one end of each follower member, the detents being located on opposite sides of the block and engage said arms to hold the cam vertically in place when the followers are held apart by the cam.

12. A zero insertion force connector block of the type having a body with a bottom wall and opposed parallel side walls, two rows of terminals mounted on the body and extending along the inner surface of each side wall, a pair of follower members positioned in the body between the rows of terminals, and a connection securing the follower members to the body while permitting free movement of each follower member toward and away from an adjacent row of terminals, the improvement comprising a cam free of the body secured to the block in the interface between the follower members, the cam including a work portion in the interface and an operator extending outwardly of the follower members whereby actuation of the cam by means of the operator moves the follower members apart to stress the terminals and form electrical connections with adjacent contacts inserted into the block, the follower members and the cam forming a compressively rigid assembly floating in the block when the followers are separated by the cam.

13. A zero insertion force connector block as in claim 12 including means for maintaining the cam in position holding the follower members apart in the assembly.

14. A zero insertion force connector block as in claim 12 wherein said follower members are alike 15. A zero insertion force connector block as in claim 12 including a slot on one of the follower members at the interface, said cam is rotary and includes a pair of opposed cam lobes in the interface between the follower members, a bearing extending through the slot, said cam and bearing being connected to said operator whereby rotation of the operator forces the lobes against the sides of the interface to separate the follower members.

16. A zero insertion force connector block as in claim 12 wherein said interface is defined by a pair of flat, adjacent side surfaces on the follower members and the cam includes two opposed lobes spaced apart along the interface, a bearing associated with each lobe and a radial arm at one end of the block, the follower members including a pair of slots at the interface surrounding the bearings and lock means for holding the arm in a desired rotary position.

17. A zero insertion force connector block as in claim 16 including lock ridges on the ends of the follower members extending between the terminal rows and latches extending upwardly from the bottom wall of the body past the lock ridges, the latches including retaining lips projecting toward the follower members over the tops of the lock ridges so that the latches confine the follower members in the body on the bottom wall while permitting movement of the follower members toward and away from the terminals.

* * * * *